(12) United States Patent
Nakagawa et al.

(10) Patent No.: US 7,538,363 B2
(45) Date of Patent: May 26, 2009

(54) SOLID-STATE IMAGING DEVICE AND METHOD FOR FABRICATING THE SAME

(75) Inventors: Atsuo Nakagawa, Osaka (JP); Mamoru Honjo, Osaka (JP); Yoshiaki Nishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 295 days.

(21) Appl. No.: 11/708,470

(22) Filed: Feb. 21, 2007

(65) Prior Publication Data
US 2007/0272829 A1    Nov. 29, 2007

(30) Foreign Application Priority Data
May 29, 2006   (JP)   .............................. 2006-148169

(51) Int. Cl.
*H01L 31/0328*   (2006.01)
(52) U.S. Cl. .................. 257/184; 257/187; 257/222; 257/291; 257/E31.058
(58) Field of Classification Search ............. 257/184, 257/187, 192, 222, 291
See application file for complete search history.

(56) References Cited

U.S. PATENT DOCUMENTS

| | | | |
|---|---|---|---|
| 5,621,550 A | * | 4/1997 | Oku .............................. 349/5 |
| 6,960,817 B2 | * | 11/2005 | Ogura et al. ................. 257/448 |
| 2003/0136981 A1 | * | 7/2003 | Sugiyama .................... 257/222 |

FOREIGN PATENT DOCUMENTS

| | | |
|---|---|---|
| JP | 64-10666 | 1/1989 |
| JP | 8-54623 | 2/1996 |
| JP | 3617692 | 11/2004 |

\* cited by examiner

*Primary Examiner*—Wai-Sing Louie
(74) *Attorney, Agent, or Firm*—McDermott Will & Emery LLP

(57) ABSTRACT

A solid-state imaging device includes: a plurality of light-receiving parts arranged in an array in a substrate and performing photoelectric conversion on incident light; and a plurality of color separators each provided for adjacent four of the light-receiving parts arranged in two rows and two columns. In each of the color separators, absorption color filters and transmission color filters are combined.

4 Claims, 4 Drawing Sheets

SOLID-STATE IMAGING DEVICE AND METHOD FOR FABRICATING THE SAME

CROSS-REFERENCE TO RELATED APPLICATION

The disclosure of Japanese Patent Application No. 2006-148169 filed in Japan on May 29, 2006 including specification, drawings and claims is incorporated herein by reference in its entirety.

BACKGROUND OF THE INVENTION (1) Field of the Invention

The present invention relates to solid-state imaging devices and methods for fabricating the devices, and particularly relates to a sensitive solid-state imaging device including color separators with high light transmittance and a method for fabricating the device.

(2) Background Art

Solid-state imaging devices such as CCD solid-state imaging devices and MOS solid-state imaging devices are used for various image input equipment such as video cameras, digital still cameras and facsimiles.

In a solid-state imaging device, a microlens is generally provided on a chip in order to increase the amount of light incident on light-receiving parts for performing photoelectric conversion (see, for example, Japanese Unexamined Patent Publication No. 64-10666). A microlens is, for example, a layer made of an inorganic or organic transparent material and processed into a convex shape and focuses light by refracting incident light at the convex surface. However, in a conventional solid-state imaging device including color filters, only one-third of focused light enters light-receiving parts.

To obtain a color image in a solid-state imaging device, it is necessary to decompose focused light into color components and then make the respective color components enter light-receiving parts. Color components are generally separated by using absorption color filters (color separators) respectively associated with three colors of red (R), green (G) and blue (B). A green absorption filter, for example, absorbs red light and blue light and transmits only green light. Accordingly, when light passes through the absorption color filter, two-thirds of the light is absorbed. As a result, light incident on light-receiving parts is reduced to one-third of focused light, so that the sensitivity of the solid-state imaging device decreases.

On the other hand, transmission color filters are used in, for example, display apparatus. The transmission color filters are formed in combination with dichroic mirrors each of which transmits light with a specific wavelength and reflects light with the other wavelengths (see, for example, Japanese Unexamined Patent Publication No. 8-54623). Accordingly, in the case of using transmission color filters in a solid-state imaging device, if a dichroic mirror which transmits only green light, for example, is used to separate green light and make the green light enter a light-receiving part and reflected light from which the green light has been separated is further separated and caused to enter other light-receiving parts, light incident on the solid-state imaging device is used without waste.

However, when the conventional transmission color filters are used in a solid-state imaging device, the following problems arise. The solid-state imaging device uses color filters in a Bayer pattern in which adjacent four light-receiving parts arranged in two rows and two columns are generally used as a set so that green light enters two of the light-receiving parts and red light and blue light enter the other two light-receiving parts. This is because human vision has higher sensitivity to green light and, therefore, the number of light-receiving parts which receive green light is increased so as to enhance the resolution of an image. However, the conventional transmission color filters separate incident light into three light beams of red, green and blue. Accordingly, light-receiving parts which receive red light, green light and blue light, respectively, are arranged in a line, thus making it difficult to arrange color filters in a Bayer pattern.

SUMMARY OF THE INVENTION

It is therefore an object of the present invention to enable a solid-state imaging device including color separators arranged in a Bayer pattern and having high light transmittance to be easily provided.

To achieve the object, according to the present invention, a solid-state imaging device includes color separators in which absorption color filters and transmission color filters are combined.

Specifically, a solid-state imaging device according to the present invention includes: a plurality of light-receiving parts arranged in an array in a substrate and performing photoelectric conversion on incident light; and a plurality of color separators each provided for adjacent four of the light-receiving parts arranged in two rows and two columns, wherein the four light-receiving parts are a first light-receiving part, a second light-receiving part, a third light-receiving part and a fourth light-receiving part, each of the color separators includes a first optical element part for guiding incident light to a first optical path entering the first light-receiving part, a second optical element part for guiding incident light to a second optical path entering the second light-receiving part located in a row and a column which are different from a row and a column on which the first light-receiving part is located, a first light-absorbing filter formed on the first optical path, absorbing light of a first color of the three primary colors of light and transmitting second and third colors of the three primary colors of light; a second light-absorbing filter formed on the second optical path, absorbing light of the second color and transmitting light of the first and third colors; a first color-separating element formed between the first light-absorbing filter and the first light-receiving part, transmitting light of the third color to have the transmitted light enter the first light-receiving part, reflecting light of the second color to guide the reflected light to a third optical path crossing the first optical path; a second color-separating element formed between the second light-absorbing filter and the second light-receiving part, transmitting light of the third color to have the transmitted light enter the second light-receiving part, reflecting light of the first color to guide the reflected light to a fourth optical path crossing the second optical path; a first mirror element formed on the third optical path, having light traveling on the third optical path, and having the reflected light enter the third light-receiving part located on the row on which the first light-receiving part is located and a column different from the column on which the first light-receiving part is located, and a second mirror element formed on the fourth optical path, reflecting light traveling on the fourth optical path, and having the reflected light enter the fourth light-receiving part located on the row on which the second light-receiving part is located and a column different from the column on which the second light-receiving part is located.

In the solid-state imaging device, two-thirds of focused light enters light-receiving parts. Accordingly, the proportion of light incident on the light-receiving parts is higher than that in a conventional solid-state imaging device including absorption color filters, so that the sensitivity is enhanced. In addition, since light-absorbing filters and transmission color-separating elements are combined, incident light only needs to be separated into two color components, so that a primary-color Bayer pattern is easily achieved.

In the solid-state imaging device, it is preferable that the light of the first color is red light, the light of the second color is blue light, and the light of the third color is green light.

In the solid-state imaging device, each of the first light-absorbing filter and the second light-absorbing filter is preferably continuously formed for an associated row. With this configuration, light-absorbing filters are easily formed.

In the solid-state imaging device, each of the first optical element part and the second optical element part preferably includes: a microlens element for focusing incident light; and a collimator element for forming incident light focused by the microlens element into parallel light.

A method for fabricating a solid-state imaging device according to the present invention is a method for fabricating a solid-state imaging device in which a plurality of pixels for receiving red light, a plurality of pixels for receiving green light and a plurality of pixels for receiving blue light are arranged on a semiconductor substrate to form a primary-color Bayer pattern. The method includes the steps of: forming a plurality of light-receiving parts in an array in the semiconductor substrate; forming a prism formation film on the semiconductor substrate and then patterning the prism formation film, thereby forming prisms having slopes above the respective light-receiving parts; forming a first dielectric film on the slopes of prisms formed above the light-receiving parts serving as pixels for receiving green light out of the prisms, thereby forming color-separating elements for transmitting green light and reflecting light of the other colors; forming a second dielectric film on the slopes of prisms formed above the light-receiving parts serving as pixels for receiving red light and pixels for receiving blue light out of the prisms, thereby forming mirror elements; forming a planarized film covering the color-separating elements and the mirror elements; forming a first light-absorbing filter for absorbing red light over a portion of the planarized film located above a row including the light-receiving parts serving as the pixels for receiving blue light; and forming a second light-absorbing filter for absorbing blue light over a portion of the planarized film located above a row including the light-receiving parts serving as the pixels for receiving red light.

The method for fabricating a solid-state imaging device according to the present invention enables easy formation of color-separating elements. In addition, light-absorbing filters are formed for every row, so that the formation of the color absorbing filters is also simplified. Accordingly, a solid-state imaging device including color separators arranged in a Bayer pattern and having high light transmittance is easily fabricated.

BRIEF DESCRIPTION OF THE DRAWINGS

FIG. 1A is a plan view, FIG. 1B is a cross-sectional view taken along the line Ib-Ib in FIG. 1A, and FIG. 1C is a cross-sectional view taken along the line Ic-Ic in FIG. 1A.

DETAILED DESCRIPTION OF THE INVENTION

Figure 1A:
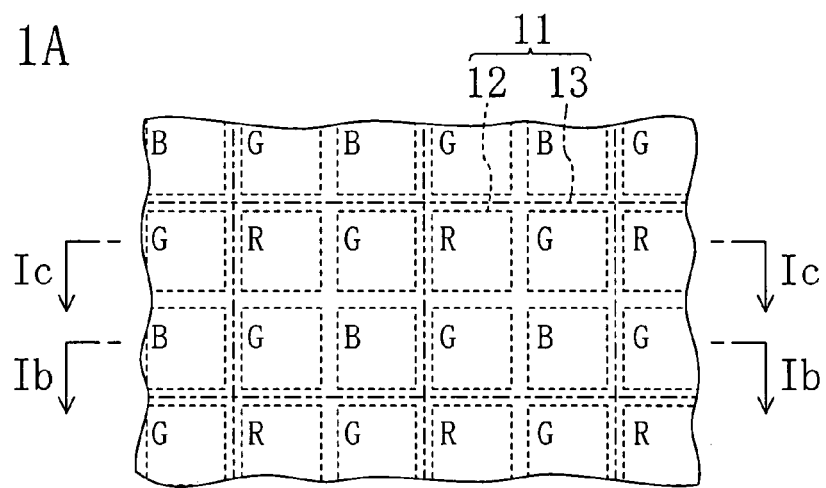
FIGS. 1A through 1C illustrate a solid-state imaging device according to an embodiment of the present invention.
Figure 1B:
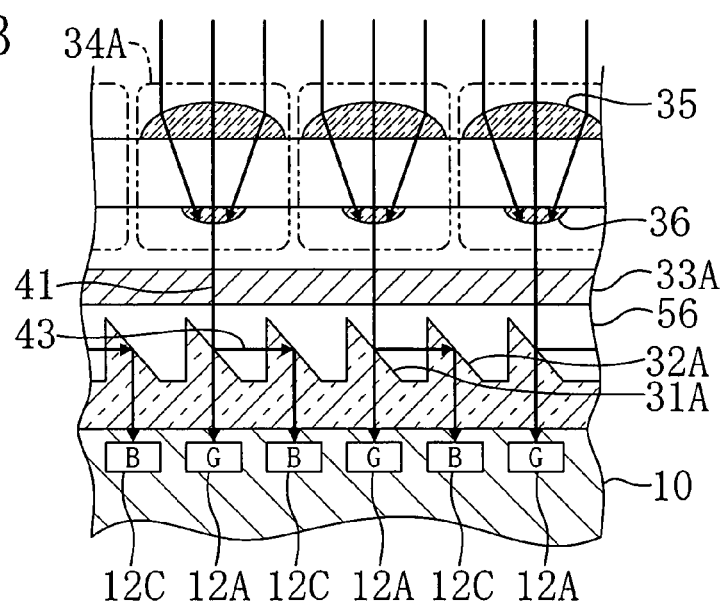
Figure 1C:
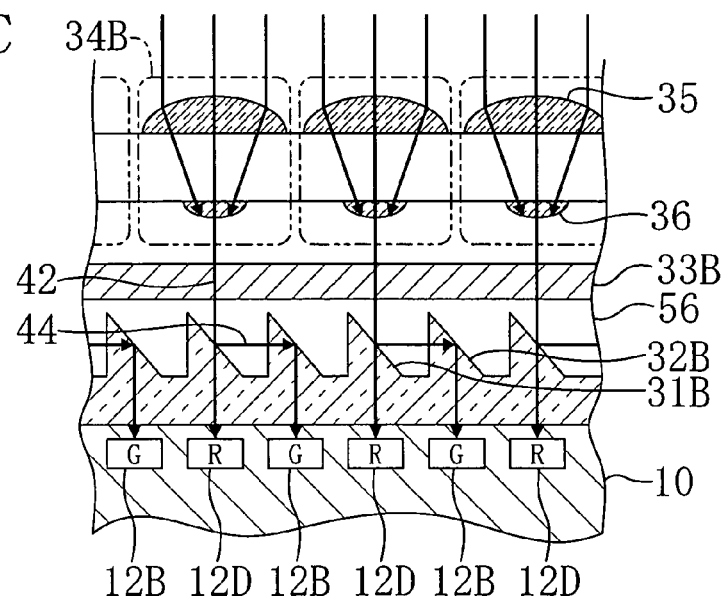

An embodiment of the present invention will be described with reference to the drawings. FIGS. 1A through 1C illustrate a solid-state imaging device according to an embodiment of the present invention. FIG. 1A is a plan view, FIG. 1B is a cross-sectional view taken along the line Ib-Ib in FIG. 1A, and FIG. 1C is a cross-sectional view taken along the line Ic-Ic in FIG. 1A.

As illustrated in FIGS. 1A through 1C, a solid-state imaging device of this embodiment includes: a plurality of light-receiving parts 12 arranged in an array in a substrate 10; and a plurality of color separators 13 which are color filters. Each of the color separators 13 is associated with every adjacent four of the light-receiving parts 12 arranged in two rows and two columns. Four light-receiving parts 12 and one color separator 13 constitute a base pixel unit 11.

The base pixel unit 11 includes: first and second light-receiving parts 12A and 12B serving as G pixels for receiving green light; a third light-receiving part 12C serving as a B pixel for receiving blue light; and a fourth light-receiving part 12D serving as an R pixel for receiving red light. The second light-receiving part 12B is located in a row and a column different from a row and a column on which the first light-receiving part 12A is located. The third light-receiving part 12C is located in the row on which the first light-receiving part 12A is located and a column different from the column on which the first light-receiving part 12A is located. The fourth light-receiving part 12D is located on a row and a column different from the row and the column on which the second light-receiving part 12B is located. The base pixel units 11 are repeatedly arranged so that a primary-color Bayer pattern in which R pixels, G pixels and B pixels are arranged to form a mosaic pattern.

Each of the color separators 13 includes: a first color-separating element 31A formed above the first light-receiving part 12A, transmitting green light and reflecting blue light; and a second color-separating element 31B formed above the second light-receiving part 12B, transmitting green light and reflecting red light. In the solid-state imaging device of this embodiment, each of the first color-separating element 31A and the second color-separating element 31B is a dichroic mirror formed by stacking dielectric films on the slope of a prism.

A first mirror element 32A is formed above the third light-receiving part 12C and a second mirror element 32B is formed above the fourth light-receiving part 12D.

A first light-absorbing filter 33A for absorbing red light is formed above the first color-separating element 31A and the first mirror element 32A. A second light-absorbing filter 33B for absorbing blue light is formed above the second color-separating element 31B and the second mirror element 32B. In the solid-state imaging device of this embodiment, each of the first light-absorbing filter 33A and the second light-absorbing filter 33B is continuously formed for an associated row. The first light-absorbing filter 33A and the second light-absorbing filter 33B are a cyan filter and a yellow filter, respectively, made of dyes, for example.

First optical element parts 34A each including an on-chip microlens 35 which is a convex lens for focusing light and a collimator element 36 are formed above the first light-absorbing filter 33A. Second optical element parts 34B are formed above the second light-absorbing filter 33B.

Incident light entering each of the first optical element parts 34A is focused by the microlens 35 and the focused light is converted into parallel light by the collimator element 36 and is guided to a first optical path 41. Light guided to the first optical path 41 enters the first light-absorbing filter 33A so that a red component of the light is removed. Green light and blue light after the removal of the red component enter the first color-separating element 31A. Green light passes through the first color-separating element 31A and enters the first light-receiving part 12A. On the other hand, blue light is reflected by the first color-separating element 31A and is guided to a third optical path 43 extending substantially in parallel with the substrate 10 toward the third light-receiving part 12C. Light guided to the third optical path 43 is reflected by the first mirror element 32A and enters the third light-receiving part 12C.

In the same manner, incident light entering each of the second optical element parts 34B is focused by the microlens 35 and the focused light is converted into parallel light by the collimator element 36 and is guided to a second optical path 42. Light guided to the second optical path 42 enters the second light-absorbing filter 33B so that a blue component is removed. Green light and red light after the removal of the blue component enter the second color-separating element 31B. Green light passes through the second color-separating element 31B and enters the second light-receiving part 12B. On the other hand, red light is reflected by the second color-separating element 31B and is guided to a fourth optical path 44 extending substantially in parallel with the substrate 10 toward the fourth light-receiving part 12D. Light guided to the fourth optical path 44 is reflected by the second mirror element 32B and enters the fourth light-receiving part 12D.

Out of light focused by the microlens 35 in each of the first optical element parts 34A, red light is absorbed in the first light-absorbing filter 33A and green light and blue light enter the first light-receiving part 12A and the third light-receiving part 12C, respectively. Out of light focused by the microlens 35 in each of the second optical element parts 34B, blue light is absorbed in the second light-absorbing filter 33B and green light and red light enter the second light-receiving part 12B and the fourth light-receiving part 12D, respectively. Accordingly, in the solid-state imaging device of this embodiment, two-thirds of light focused by a microlens is subjected to photoelectric conversion by light-receiving parts. As a result, the sensitivity is enhanced, as compared to a conventional solid-state imaging device including absorbing color separators in which two-thirds of light focused by a microlens is absorbed.

Unlike conventional transmission color separators, incident light is only separated into two color components in the device of this embodiment, so that a primary-color Bayer arrangement in which light-receiving parts for receiving red light, green light and blue light are arranged to form a mosaic pattern is easily formed. In addition, the thickness of color separators is allowed to be reduced.

To reduce the thickness of the solid-state imaging device, the angle of each of the first color-separating element 31A and the second color-separating element 31B with respect to the substrate 10 is preferably in the range from 30° to 60°. This is because the thickness of the color separators 13 is the smallest when the first optical path 41 and the second optical path 42 are vertical to the substrate 10 and the third optical path 43 and the fourth optical path 44 are horizontal to the substrate 10.

On the other hand, in terms of separation property of dichroic mirrors, the angle of each of the first color-separating element 31A and the second color-separating element 31B with respect to the substrate 10 is preferably 30° or less. This is because the transmission wavelength range of a dichroic mirror formed of dielectric films depends on the polarization direction and incident angle of incident light.

Figure 2A:
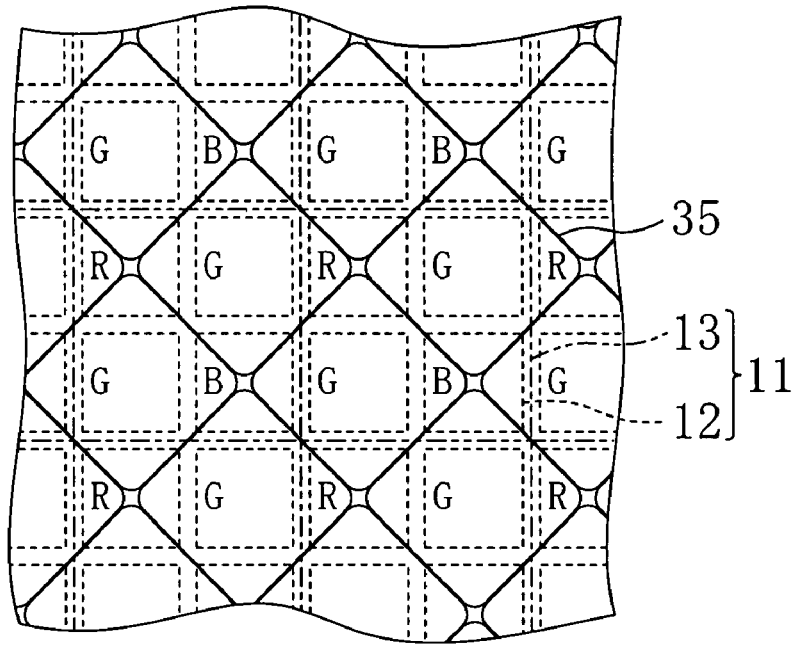
FIGS. 2A and 2B are plan views illustrating arrangements of microlenses in the solid-state imaging device.
Figure 2B:
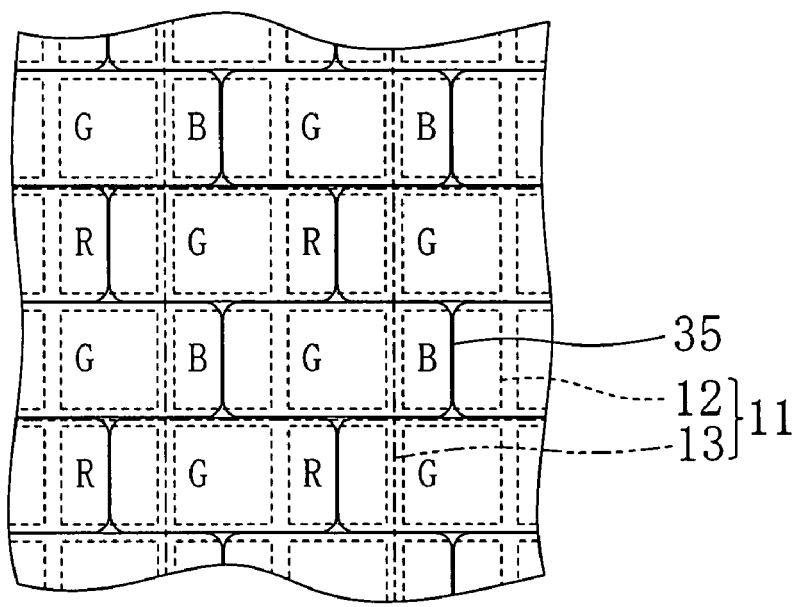

The microlens 35 is preferably oriented such that the center of the first light-receiving part 12A or the second light-receiving part 12B coincides with the center of the center of the optical axis of the microlens 35 and the microlens 35 covers all the effective pixel regions. For example, as illustrated in FIG. 2A, it is preferable that the mask for the microlens 35 is square and is inclined 45° with respect to the direction of arrangement of light-receiving parts. This allows all the effective pixel regions where light-receiving parts are formed to be covered without waste. Alternatively, as illustrated in FIG. 2B, the on-chip microlens 35 may be rectangular in plan view.

Now, a method for fabricating a solid-state imaging device according to this embodiment will be described with reference to the drawings. FIGS. 3A through 3C and FIGS. 4A through 4D show respective process steps of the method for fabricating a solid-state imaging device of this embodiment. FIGS. 3A through 3C and FIGS. 4A through 4D are cross-sectional views taken along the line Ib-Ib in FIG. 1A.

Figure 3A:
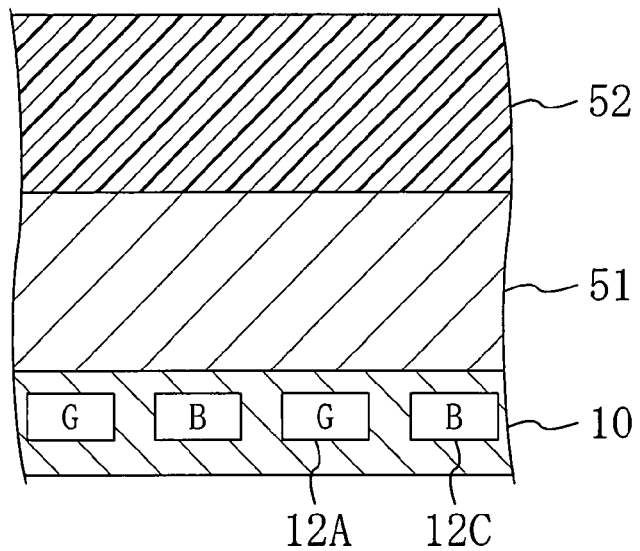
FIGS. 3A through 3C are cross-sectional views showing respective process steps of a method for fabricating a solid-state imaging device according to an embodiment of the present invention in the order of fabrication.

First, as shown in FIG. 3A, light-receiving parts 12 for performing photoelectric conversion are formed in an array in a substrate 10. Then, a transparent first planarized film 51 made of, for example, silicon dioxide ($SiO_2$) is formed on the substrate 10. The first planarized film 51 is a prism formation film for forming prisms. Subsequently, a synthetic resin film 52 is formed by spin coating on the first planarized film 51 and then is dried at low temperature.

Figure 3B:
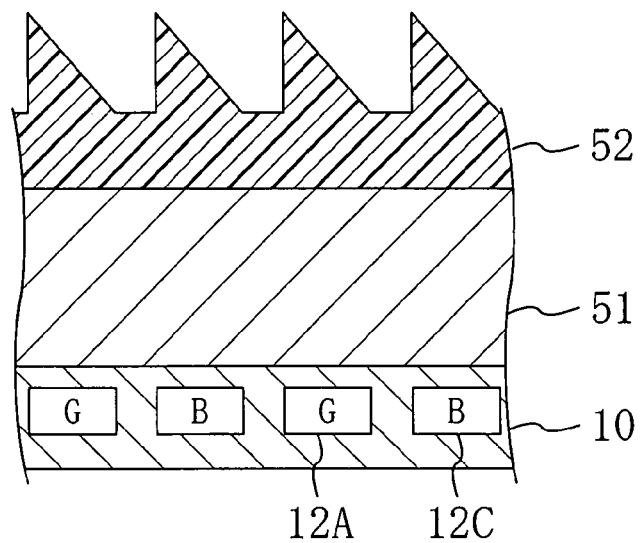

Next, as shown in FIG. 3B, ultraviolet light such as a g-line (wavelength: 436 nm) or an i-line (wavelength: 365 nm) is applied using a gray-tone mask and patterning is performed, thereby forming prisms above the respective light-receiving parts 12.

Figure 3C:
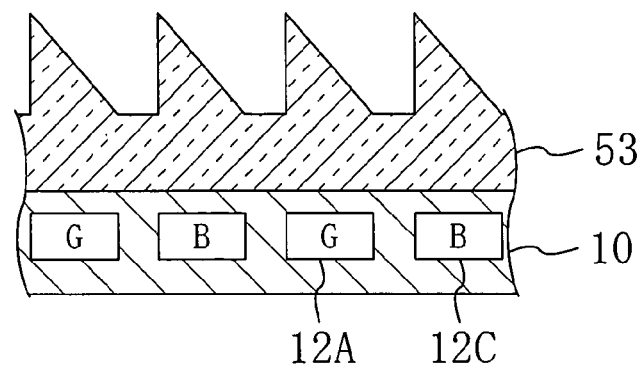

Then, as shown in FIG. 3C, the entire surface is etched back and the pattern of the synthetic resin film 52 is transferred onto the first planarized film 51, thereby forming a prism base having a plurality of prism portions 53.

Figure 4A:
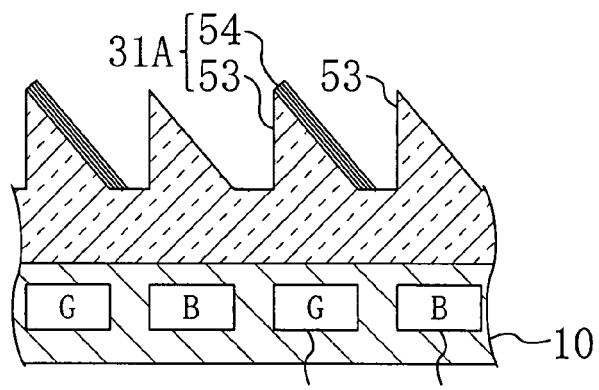
FIGS. 4A through 4D are cross-sectional views showing respective process steps of the method for fabricating a solid-state imaging device in the order of fabrication.

Thereafter, as shown in FIG. 4A, a first dielectric film 54 is formed on the slopes of the prism portions 53 formed above the first light-receiving part 12A and the second light-receiving part 12B (not shown) serving as G pixels, thereby forming a first color-separating element 31A and a second color-separating element 31B (not shown). The first dielectric film 54 is formed by alternately stacking, for example, $SiO_2$ and titanium oxide ($TiO_2$) by, for example, CVD. At this time, the amounts of $SiO_2$ and $TiO_2$ are adjusted so that dichroic mirrors transmitting only green light are formed.

Figure 4B:
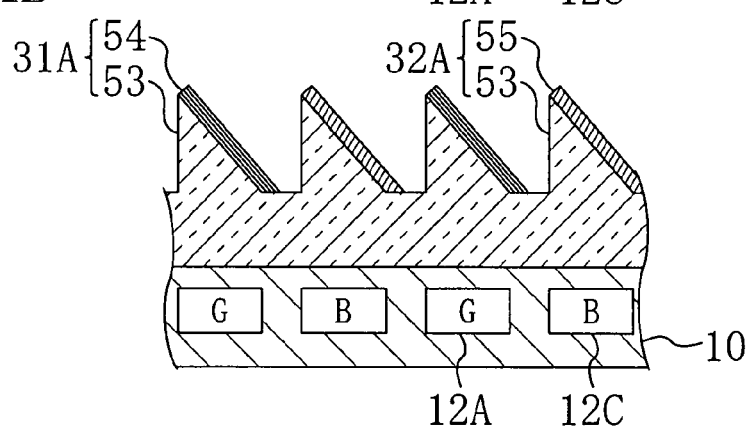

Subsequently, as shown in FIG. 4B, a second dielectric film 55 as a stack of $SiO_2$ and $TiO_2$ is formed on the slopes of the prism portions 53 located above the third light-receiving part 12C serving as a B pixel and the fourth light-receiving part 12D (not shown) serving as an R pixel, thereby forming a first mirror element 32A and a second mirror element 32B (not shown).

Figure 4C:
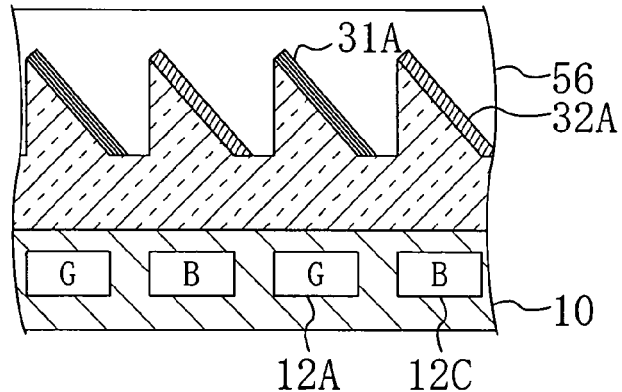

Then, as shown in FIG. 4C, a second planarized film 56 made of, for example, borophosphosilicate glass (BPSG) is deposited by CVD.

Figure 4D:
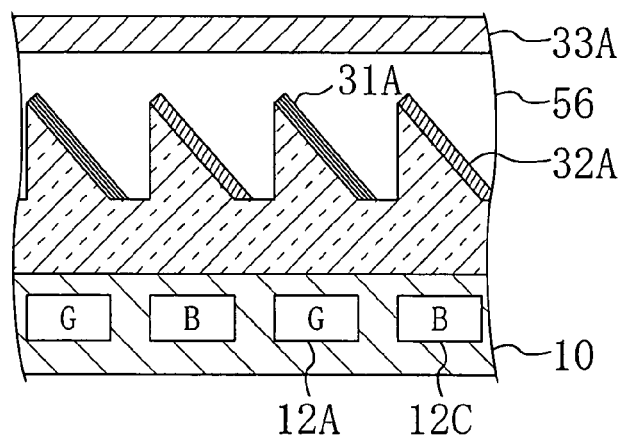

Thereafter, as shown in FIG. 4D, a first light-absorbing filter 33A is formed over a portion of the second planarized film 56 located above the first light-receiving part 12A and the third light-receiving part 12C. A second light-absorbing filter 33B (not shown) is formed over a portion of the second planarized film 56 located above the second light-receiving part 12B and the fourth light-receiving part 12D. The first light-absorbing filter 33A and the second light-absorbing filter 33B only need to be formed in such a manner that a resin to which a dye, for example, is added is applied onto the second planarized film 56 by spin coating, the surface is irradiated with ultraviolet light such as a g-line (wavelength: 436 nm) or an i-line (wavelength: 365 nm) using a photomask and then patterning is performed.

Subsequently, though not shown, an intermediate film is formed on the first light-absorbing filter 33A and the second light-absorbing filter 33B, and then a collimator element 36 and a microlens 35 are formed by known methods.

In this embodiment, the stack of $SiO_2$ and $TiO_2$ is used for the first dielectric film 54 and the second dielectric film 55. Alternatively, a stack of a low-refractive-index material such as magnesium fluoride ($MgF_2$) and a high-refractive-index material such as tantalum oxide ($Ta_2O_5$) may be used.

As described above, the present invention allows a solid-state imaging device including color separators arranged in a Bayer pattern and having high light transmittance and a method for fabricating the device to be easily provided. The present invention is useful for a sensitive solid-state imaging device and a method for fabricating the device, for example.

What is claimed is:

1. A solid-state imaging device, comprising:
   a plurality of light-receiving parts arranged in an array in a substrate and performing photoelectric conversion on incident light; and
   a plurality of color separators each provided for adjacent four of the light-receiving parts arranged in two rows and two columns,
   wherein the four light-receiving parts are a first light-receiving part, a second light-receiving part, a third light-receiving part and a fourth light-receiving part,
   each of the color separators includes
      a first optical element part for guiding incident light to a first optical path entering the first light-receiving part,
      a second optical element part for guiding incident light to a second optical path entering the second light-receiving part located in a row and a column which are different from a row and a column on which the first light-receiving part is located,
      a first light-absorbing filter formed on the first optical path, absorbing light of a first color of the three primary colors of light and transmitting second and third colors of the three primary colors of light;
      a second light-absorbing filter formed on the second optical path, absorbing light of the second color and transmitting light of the first and third colors;
      a first color-separating element formed between the first light-absorbing filter and the first light-receiving part, transmitting light of the third color to have the transmitted light enter the first light-receiving part, reflecting light of the second color to guide the reflected light to a third optical path crossing the first optical path;
      a second color-separating element formed between the second light-absorbing filter and the second light-receiving part, transmitting light of the third color to have the transmitted light enter the second light-receiving part, reflecting light of the first color to guide the reflected light to a fourth optical path crossing the second optical path;
      a first mirror element formed on the third optical path, having light traveling on the third optical path, and having the reflected light enter the third light-receiving part located on the row on which the first light-receiving part is located and a column different from the column on which the first light-receiving part is located, and
      a second mirror element formed on the fourth optical path, reflecting light traveling on the fourth optical path, and having the reflected light enter the fourth light-receiving part located on the row on which the second light-receiving part is located and a column different from the column on which the second light-receiving part is located.

2. The solid-state imaging device of claim 1, wherein the light of the first color is red light,
   the light of the second color is blue light, and
   the light of the third color is green light.

3. The solid-state imaging device of claim 1, wherein each of the first light-absorbing filter and the second light-absorbing filter is continuously formed for an associated row.

4. The solid-state imaging device of claim 1, wherein each of the first optical element part and the second optical element part includes:
   a microlens element for focusing incident light; and
   a collimator element for forming incident light focused by the microlens element into parallel light.

* * * * *